(12) United States Patent
Sato

(10) Patent No.: US 7,053,008 B2
(45) Date of Patent: May 30, 2006

(54) RESIST APPLICATION METHOD AND DEVICE

(75) Inventor: Takehiro Sato, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/652,314

(22) Filed: Sep. 2, 2003

(65) Prior Publication Data

US 2004/0048201 A1    Mar. 11, 2004

(30) Foreign Application Priority Data

Sep. 10, 2002    (JP) ............................. 2002-264105

(51) Int. Cl.
*H01L 21/31*    (2006.01)

(52) U.S. Cl. .................. 438/782; 438/5; 438/780; 438/781

(58) Field of Classification Search ................ 438/782, 438/780, 905, 5, 781; 427/240, 314, 444; 437/444
See application file for complete search history.

(56) References Cited

U.S. PATENT DOCUMENTS

| | | | | |
|---|---|---|---|---|
| 6,332,724 | B1 * | 12/2001 | Yano et al. | 396/611 |
| 6,458,208 | B1 * | 10/2002 | Anai et al. | 118/52 |
| 6,569,696 | B1 * | 5/2003 | Suenaga et al. | 438/14 |
| 2003/0017256 | A1 * | 1/2003 | Shimane | 427/9 |
| 2004/0026031 | A1 * | 2/2004 | Smith | 156/293 |

FOREIGN PATENT DOCUMENTS

| | | |
|---|---|---|
| JP | 62-35264 | 7/1987 |
| JP | 4-99310 | 3/1992 |
| JP | 5-234866 | 9/1993 |
| JP | 5-315233 | 11/1993 |
| JP | 6-302507 | 10/1994 |
| JP | 10-256139 | 9/1998 |

* cited by examiner

*Primary Examiner*—George Fourson
*Assistant Examiner*—Julio J. Maldonado
(74) *Attorney, Agent, or Firm*—Westerman, Hattori, Daniels & Adrian, LLP

(57) ABSTRACT

The resist application method comprises the steps of: thermal processing for evaporating water from the surface of a wafer 10; making the surface of the wafer 10 hydrophobic with a hydrophobic processing material; and applying a resist onto the wafer 10, and the step of thermal processing to the step of making the surface of the wafer 10 hydrophobic are performed in a dehumidified atmosphere.

7 Claims, 4 Drawing Sheets

0/16

109/184

RESIST APPLICATION METHOD AND DEVICE

CROSS-REFERENCE TO RELATED APPLICATION

This application is based upon and claims priority of Japanese Patent Application No. 2002-264105, filed on Sep. 10, 2002, the contents being incorporated herein by reference.

BACKGROUND OF THE INVENTION

The present invention relates to a resist application method and device for applying a resist to a substrate after the surface of the substrate has been subjected to hydrophobic processing with hexamethyldisilazane.

Conventionally in fabricating semiconductor devices, when a resist is applied to a substrate, such as a wafer or others, generally the surface of the substrate is made hydrophobic with hexamehtyldisilazane (HMDS) as pre-processing. HMDS is a good silylation agent, and easily silylates hydroxyl groups on the surface of the silicon substrate, etc. to make the substrate surface hydrophobic.

The hydrophobic processing with HMDS enhances adhesion between the resist film and the substrate surface, whereby in the following patterning, the occurrence of unsatisfactory pattern transfer, etc. can be suppressed.

The hydrophobic processing of a wafer surface with HMDS is made as follows.

First, HMDS, which is liquid at the room temperature, is bubbled with nitrogen gas while being heated. The nitrogen gas containing the HMDS produced by the bubbling is injected to a substrate on a hot plate whose temperature is controlled within a range of 30–100° C. in a tightly closed processing chamber.

Then, usually the substrate is cooled at the room temperature, and a certain amount of resist is dropped onto the rotating substrate in an environment whose temperature and humidity are controlled, whereby the resist is applied to the substrate. The resist applied to the substrate is dried and solidified by heat processing, and a resist film is formed. The resist film thus formed on the substrate is subjected to an exposure step to be patterned into a required shape, as of a wiring pattern or others.

In such resist applying step, for better adhesion between the resist and the substrate, various methods have been so far proposed.

For example, Japanese Published Patent Application No. Hei 04-99310 (1992) (pp. 2–3, FIGS. 1 and 2) discloses the method that prior to the HMDS processing, heated nitrogen gas is injected to a substrate to thereby remove water from the substrate surface.

Japanese Published Patent Application No. Hei 05-315233 (1993) (Paragraphs 0021–0022, FIG. 2) and Japanese Published Patent Application No. Hei 06-302507 (1994) (Paragraphs 0014–0015, FIG. 1) disclose the method that prior to the HMDS processing, water on the surface of a substrate is removed by reduced pressure processing.

Japanese Examined Patent Application Publication No. Sho 62-35264 (1987) (pp. 2–3, FIGS. 1–3) discloses the method that the processing from the HMDS processing to the application of the resist is performed in a nitrogen atmosphere.

Japanese Published Patent Application No. Hei 10-256139 (1998) (Paragraphs 0026–0033, FIG. 1) discloses the method that dry air is caused to flow in a coater cup where a resist is applied, for the purpose of removing humidity around the coater cup and recycling the resist.

Japanese Published Patent Application No. Hei 05-234866 (1993) discloses the method that a plasma processing unit and an HMDS processing unit are disposed in one and the same chamber to thereby remove water on substrate surfaces by plasma processing.

The internal unit of the resist application device, where the above-described resist application is performed is fed with an atmosphere in a clean room through a HEPA (High Efficiency Particulate Air) filter. Recently, in applying a chemically amplified resist used for mass production, an atmosphere in a clean room is fed into the internal unit through a chemical filter so as to remove basic substances, such as ammonia, etc., which inactivate the resist.

However, in the conventional resist application device, the humidity of an atmosphere in a clean room, which is to be fed into the internal unit, has not been especially controlled.

Accordingly, HMDS used for the hydrophobic processing before the resist application reacts with water contained in the fed atmosphere of the clean room to be decomposed into siloxane-group substances, such as trimethylsilanol. Resultantly, it is often that the adhesion between the resist and substances is lowered.

For the prevention of such reaction of HMDS with water in the atmosphere, as described above in connection with the prior art, a resist application device which controls the water content of the atmosphere in the HMDS processing unit is also so far known. However, the water contents of the atmosphere before and after the HMDS processing have not been controlled. For example, in cooling a substrate after the baking prior to the HMDS processing, in transferring the substrate or in cooling the substrate after the HMDS processing, the water contents of the atmosphere have not been especially controlled. Accordingly, re-adsorption of water to the substrate surface, etc. takes place. It cannot be said that the humidity control in the serial processing is sufficient.

For reducing the undesirable influence by the water before and after the HMDS processing, the method as exemplified by the prior art disclosed in Japanese Examined Patent Application Publication No. Sho 62-35264 (1987) (pp. 2–3, FIGS. 1–3), in which the serial processing from the HMDS processing to the resist application is performed in an atmosphere of nitrogen gas, is known. However, the atmosphere in which the resist application is performed has also the water content decreased, which will make it difficult to form the resist film in a uniform film thickness. Also in consideration of the amount of nitrogen gas required to completely replace the processing chamber and the time required for the replacement, etc., it will be difficult to efficiently apply the resist from the viewpoint of cost and time.

The undesirable influence by the hydrolysis of the HMDS used in the hydrophobic processing on the substrate surface due to the water is not limited to the reduced adhesion between the resist and the substrate as will be described below.

Siloxane-group substances produced by the hydrolysis of the HMDS due to the water cause reactions on the surfaces of especially amorphous silicon, etc. Resultantly, after the resist has been patterned, foreign substances are often produced on the surfaces of amorphous silicon, etc. FIG. 4 is a picture of the foreign substance. The foreign substance was observed by a scanning electronic microscope.

Such foreign substances are sufficiently able to mask the etching, and are one factor for causing defects of the pattern as etched, which has much affected yields of the products.

SUMMARY OF THE INVENTION

An object of the present invention is to provide a resist application method and device which can suppress the production of foreign substances on substrate surfaces.

According to one aspect of the present invention, there is provided a resist application method comprising the steps of: thermal processing for evaporating water from the surface of a substrate; making the surface of the substrate hydrophobic with a hydrophobic processing material; and applying a resist onto the substrate, the step of thermal processing to the step of making the substrate surface hydrophobic being performed in a dehumidified atmosphere.

According to another aspect of the present invention, there is provided a resist application method comprising the steps of: thermal processing for evaporating water from the surface of a substrate; making the surface of the substrate hydrophobic with a hydrophobic processing material; and applying a resist onto the substrate, in the step of thermal processing, a temperature of the substrate being above 150° C. including 150° C.

According to further another aspect of the present invention, there is provided a resist application device comprising: a thermal processing unit for performing thermal processing to evaporate water from the surface of a substrate in a dehumidified atmosphere; a hydrophobic processing unit for making the substrate surface hydrophobic with a hydrophobic processing material, keeping the dehumidified atmosphere; and a resist application unit for applying a resist onto the substrate.

As described above, the resist application method according to the present invention comprises the steps of: thermal processing for evaporating water from the surface of a substrate; making the surface of the substrate hydrophobic with a hydrophobic processing material; and applying a resist onto the substrate, and the step of the thermal processing to the step of making the substrate surface hydrophobic are performed in a dehumidified atmosphere, whereby the hydrolysis of the hydrophobic processing material to be used in the hydrophobic processing of the substrate surface can be suppressed, and the generation of foreign substances on the substrate surface can be suppressed. The substrate surface is made hydrophobic with the hydrophobic processing material while the substrate is being heated, whereby the adhesion between the substrate and the resist can be improved. Thus, the generation of foreign substances on the substrate surface can be suppressed, and the adhesion between the substrate and the resist is improved, whereby semiconductor devices of high quality can be fabricated with high yields.

DETAILED DESCRIPTION OF THE INVENTION

Figure 1:
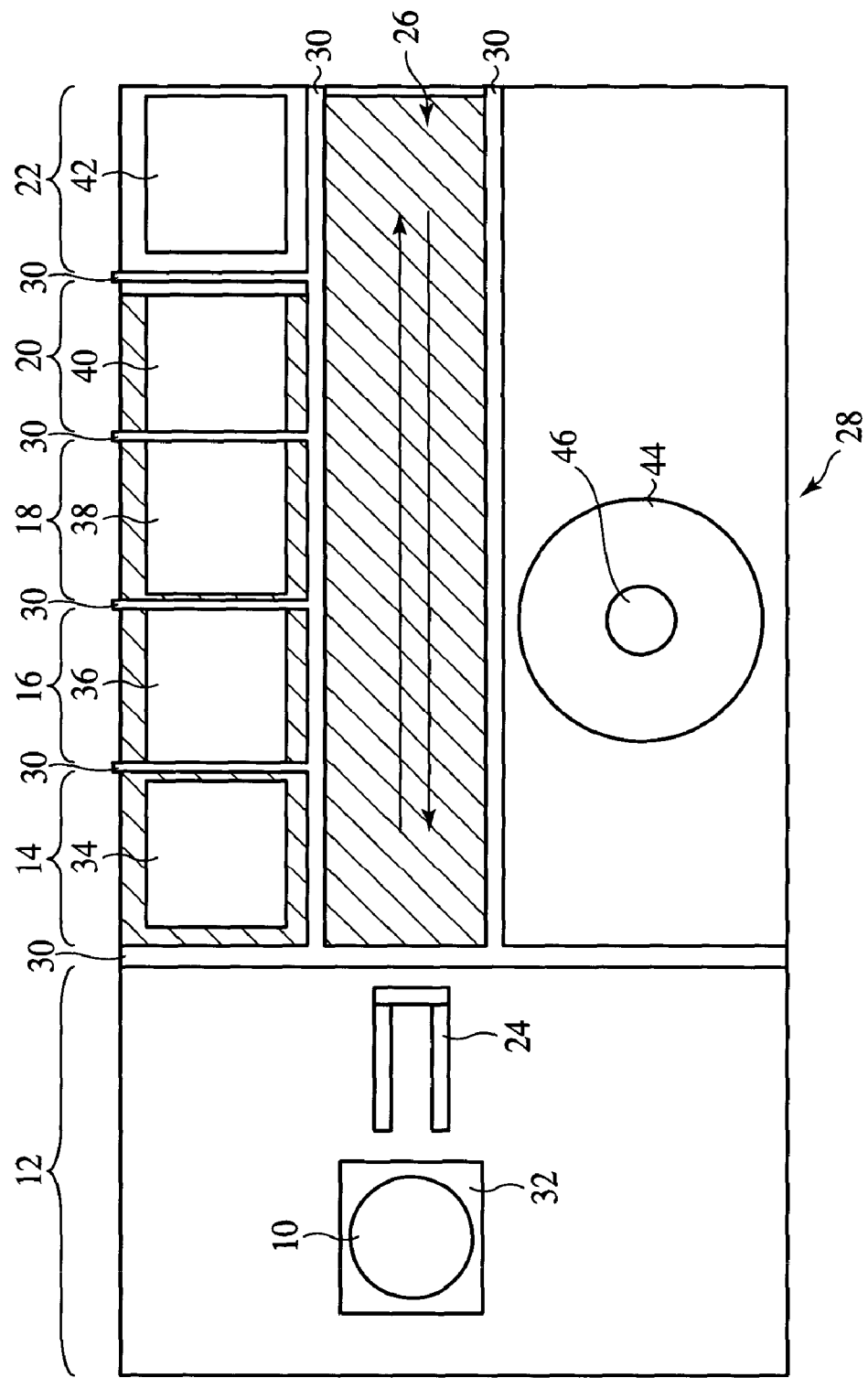
FIG. 1 is an upper side view of the resist application device according to one embodiment of the present invention, which shows a structure thereof.
Figure 2:
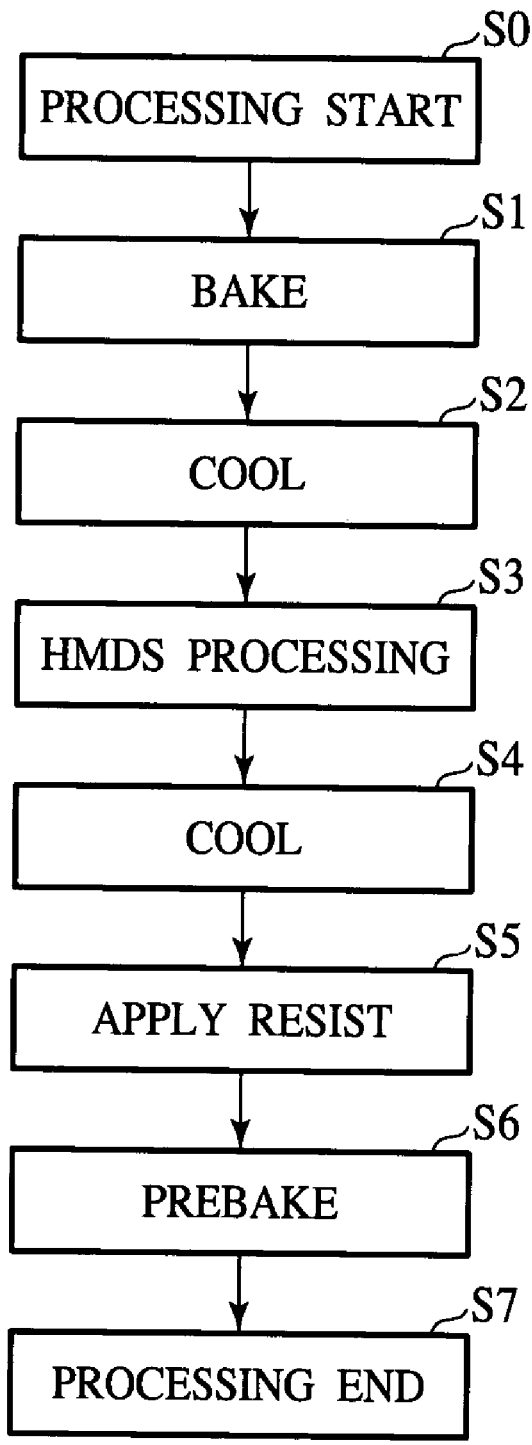
FIG. 2 is a flow chart of the steps of the resist application method according to one embodiment of the present invention.

The resist application method and device according to one embodiment of the present invention will be explained with reference to FIGS. 1 and 2. FIG. 1 is an upper side view of the resist application device according to the present embodiment, which shows a structure thereof. FIG. 2 is a flow chart of the resist application method according to the present embodiment.

[1] The Resist Application Device

The resist application device according to the present embodiment will be explained with reference to FIG. 1.

The resist application device according to the present embodiment includes a housing unit 12 which houses a wafer 10 to be coated with a resist; a first thermal processing unit 14 where the wafer 10 is subjected to thermal processing before HMDS processing; a first cooling processing unit 16 where the wafer 10 which has been thermally processed by the first thermal processing unit 14 is cooled; an HMDS processing unit 18 where the surface of the wafer 10 is subjected to hydrophobic processing with HMDS; a second cooling processing unit 20 where the wafer 10 which has been subjected to the hydrophobic processing with HMDS is cooled; and a second thermal processing unit 22 where the wafer which has been coated with the resist is thermally processed arranged adjacent to each other in the stated order.

An arm moving region 26 where a carrying arm 24 for carrying a wafer 10 to the respective processing units is provided on one sides of the first thermal processing unit 14, the first cooling processing unit 16, the HMDS processing unit 18, the second cooling processing unit 20 and the second thermal processing unit 22. A resist application unit 28 where a resist is applied to the wafer which has been cooled after the HMDS processing is provided in the region opposed to the respective processing units across the arm moving region 26.

Partition walls 30 for isolating the respective processing units from each other are provided between the respective processing units and their adjacent one. The respective processing units are connected respectively to independent exhaust systems (not shown). Openings (not shown) for letting in and out the wafer 10 by the carrying arm 24 are provided in the partition walls 30 of the respective processing units opposed to the arm moving region 26. The respective processing units are isolated chambers isolated from an atmosphere in a clean room where the resist application device is usually positioned. When the device is operated, dehumidified air, i.e., clean dry air is fed into the first thermal processing unit 14, the first cooling processing unit 16, the HMDS processing unit 18, the second cooling processing unit 20 and the arm moving region 26.

Wafers 10 to be coated with a resist are housed in the housing unit 12, mounted on a carrier 32. The carrying arm 24 is moved in the housing unit 12 and the arm moving region 26 to take the wafer 10 off the carrier 32 and carry the wafer 10 to the respective processing units.

A hot plate 34 whose temperature can be controlled in the range of, e.g., 40–250° C. is provided in the first thermal processing unit 14. When the wafer 10 is thermally processed, the wafer 10 is mounted on the hot plate 34.

A cooling plate 36 inside which water whose temperature controlled by, e.g., a thermostat or others is circulated is disposed in the first cooling processing unit 16. When the wafer 10 is subjected to the cooling processing, the wafer 10 is mounted on the cooling plate 36.

A hot plate 38 whose temperature can be controlled in the rage of, e.g., 40–250° C. is disposed in the HMDS processing unit 18. When the wafer 10 is subjected to the HMDS processing, the wafer 10 is mounted on the hot plate 38. HMDS which has been bubbled with nitrogen gas and vaporized in a storage tank (not shown) disposed outside is carried on the nitrogen gas as a carrier gas into the HMDS processing unit 18.

In the second cooling processing unit 20, a cooling plate 40 inside which water having the temperature controlled by, e.g., a thermostat or others is circulated is disposed. When the wafer 10 is subjected to the cooling processing, the wafer 10 is mounted on the cooling plate 10.

In the second thermal processing unit 22, as in the first thermal processing unit 14, a hot plate 42 whose temperature can be controlled in the range of, e.g., 40–250° C. is provided. When the wafer 10 is subjected to the thermal processing, the wafer 10 is mounted on the hot plate 42.

In the resist application unit 28, there are disposed an application cup 44 in which a resist is applied, and a wafer chuck 46 which is disposed in the application cup 44 and is rotated in horizontal plane, holding the wafer 10. A nozzle (not shown) for dropping a resist onto the wafer 10 held by the wafer chuck 46 is disposed above the wafer chuck 46.

As described above, the resist application device according to the present embodiment is characterized mainly by the first thermal processing unit 14 which thermally processes a wafer 10 before the wafer 10 is subjected to the HMDS processing. The wafer 10 is heated by the first thermally processing unit 14 before the wafer 10 is subjected to the HMDS processing, whereby water on the surface of the wafer 10 is removed, and the hydrolysis of the HMDS to be used in the hydrophobic processing of the surface can be suppressed.

The resist application device according to the present embodiment is characterized also by the hot plate 38 for heating the wafer 10 in the HMDS processing. The HMDS processing is made on the wafer which is being heated by the hot plate 38, whereby the adhesion of the resist film to the wafer 10 can be better.

The resist application device according to the present embodiment is characterized also in that while the device is in operation, dehumidified air, i.e., clean dry air is fed into the first thermal processing unit 14, the first cooling processing unit 16, the HMDS processing unit 18, the second cooling processing unit 20 and the arm moving region 26. The clean dry air is fed into the processing units into which the wafer 10 is carried, and in the dehumidified atmosphere, the wafer 10 is carried and is subjected to the serial processing, whereby re-adsorption of the water to the surface of the wafer 10 can be suppressed. Thus, the hydrolytic reaction of the HMDS to be used in the surface hydrophobic processing due to the water can be suppressed.

As described above, the resist application device according to the present embodiment suppresses the hydrolytic reaction of the HMDS to be used in the hydrophobic processing of the surface of the wafer 10, whereby the generation of foreign substances which are a cause for inconveniences, such as pattern defects, etc. on the surface of the wafer 10 with the resist developed can be suppressed. Furthermore, the adhesion between the wafer 10 and the resist film can be better. Thus, semiconductor devices of high quality can be fabricated with high yields.

The clean dry air is not fed into the resist application unit 28, which does not cause the inconvenience either that a resist film cannot be formed in a uniform thickness.

In the first thermal processing unit 14, the thermal processing is performed only by the hot plate 34, which is simple heating means without pressure reduction, which can make the device structure simpler in comparison with the device structure in which the heating is performed with a hot plate in a reduced pressure chamber.

[2] The Resist Application Method

Next, the resist application method according to the present embodiment will be explained with reference to FIGS. 1 and 2.

First, the clean dry air is fed respectively into the first thermal processing unit 14, the first cooling processing unit 16, the HMDS processing unit 18, the second cooling processing unit 20 and the arm moving region 26. Concurrently therewith, the respective processing units are exhausted by the exhaust systems associated respectively therewith to replace atmospheres in the respective processing units and the arm moving region 26 with the clean dry air. The clean dry air has, e.g., a −60° C. dew point at the atmospheric pressure. A flow rate of the fed clean dry air is, e.g., 3 L/min.

Then, the processing started (Step S0).

Next, a wafer 10 is taken off the carrier 32 in the housing unit 12 by the carrying arm 24, carried to the first thermal processing unit 14 and mounted on the hot plate 34 in the first thermal processing unit 14.

Then, the wafer 10 is heated by the hot plate 34 in the first thermal processing unit 14 set at, e.g., 225° C. for 60 seconds (Step S1). The heating temperature and heating time of the wafer 10 are not limited to 225° C. and 60 seconds and can be suitably set in accordance with various conditions, such as a wafer size, etc. so that water can be removed from the surface of the wafer 10. For example, the heating temperature may be above 100° C. including 100° C. The heating temperature of the wafer 10 is set at above 150° C. including 150° C. to thereby evaporate water on the surface of the wafer 10 in a short period of time without failure. With the heating temperature set at 200° C. including 200° C., water on the surface of the wafer 10 can be evaporated in a further shorter period of time without failure.

When the wafer 10 has been thermally processed, the wafer 10 is carried by the carrying arm 24 from the first thermal processing unit 14 to the first cooling processing unit 16, and is mounted on the cooling plate 36 in the first cooling processing unit 16. At this time, the arm moving region 26 where the wafer is to be moved, and the first cooling processing unit 16 have been fed with the dehumidified clean dry air. Thus, after the thermal processing by the first thermal processing unit 14, the re-adsorption of water to the surface of the wafer 10 can be suppressed.

Subsequently, the wafer 10 is cooled by the cooling plate 36 in the first cooling processing unit 16 (Step S2). The wafer 10 is cooled until the temperature of the wafer 10 becomes, e.g., 23° C., which is the room temperature.

After the cooling processing of the wafer 10 is completed, the wafer 10 is carried by the carrying arm 24 from the first cooling processing unit 16 to the HMDS processing unit 18 filled with dry nitrogen, and the wafer 10 is mounted on the hot plate 38 in the HMDS processing unit 18. At this time, the arm moving region 26 where the wafer 10 is moved is fed with the humidified clean dry air. Thus, after the thermal processing by the first thermal processing unit 14, the re-adsorption of water to the surface of the wafer 10 can be suppressed.

Next, the HMDS which has been vaporized by, e.g., bubbling is carried on nitrogen gas into the HMDS processing unit 18 to expose the surface of the wafer 10 to the vaporized HMDS. During this processing, the wafer 10 is kept heated to, e.g., 110° C. by the hot plate 38 in the HMDS processing unit 18 (Step S3). The heating temperature here is not limited to 110° C., and can be, e.g., above 100° C. including 100° C. as long as the re-adsorption of water to the surface of the surface 10 can be suppressed.

When the HMDS processing is over, the wafer 10 is carried by the carrying arm 24 from the HMDS processing unit 18 to the second cooling processing unit 20, and the wafer 10 is mounted on the cooling plate 40 in the second cooling processing unit 20. Subsequently, the wafer 10 is cooled by the cooling plate 40 in the second cooling processing unit 20 (Step S4). The wafer 10 is cooled until the temperature of the wafer 10 becomes, e.g., 23° C., which is the room temperature.

When the cooling processing of the wafer 10 is over, the wafer 10 is carried by the carrying arm 24 from the second cooling processing unit 20 to the resist application unit 28, the wafer 10 is held by the wafer chuck 46 in the resist application unit 38.

Then, a prescribed amount of a resist is dropped onto the surface of the wafer 10 being rotated in horizontal plane by the wafer chuck 46. The resist is thus applied to the surface of the wafer 10 by spin coating (Step S5). During this operation, the atmosphere in the resist application unit 18 is air having the humidity controlled to be, e.g., 45%. The temperature of the wafer 10 is controlled to be, e.g., 23° C. Thus, the atmosphere in the resist application unit 28 where the resist is applied has a suitable amount of water, which permits the resist film to be formed in a uniform thickness.

When the resist application is completed, the wafer 10 is carried by the carrying arm 24 from the resist application unit 28 to the second thermal processing unit 22, and the wafer 120 is mounted on the hot plate 42 in the second thermal processing unit 22. Subsequently, the wafer 10 is heated to about 120° C. by the hot plate 44 in the second thermal processing unit 22. The resist immediately after the application, which contains a suitable amount of organic solvent is thus dried and solidified (Step S6). The clean dry air which has been fed into the first thermal processing unit 14, etc. does not have to be fed into the second thermal processing unit 22. The atmosphere in the second thermal processing unit 22 may be the same as that of, e.g., the clean room. The heating temperature is not limited to about 120° C. and can be suitably set in accordance with a kind, etc. of the applied resist.

Then, the wafer 10 is carried by the carrying arm 24 from the second thermal processing unit 22 to the housing unit 12, and the wafer 10 is mounted on the carrier 32. Thus, the application of the resist by the resist application method according to the present embodiment is completed (Step S7).

The wafer 10 having the resist thus applied to is carried, mounted on the carrier 32, to the next step of the exposure etc.

As described above, according to the present embodiment, the clean dry air having the water content controlled to be small is fed into the respective processing units, the wafer 10 is subjected to the thermal processing before the HMDS processing, and the HMDS processing is performed with the wafer 10 being heated, whereby the hydrolysis of the HMDS to be used in the hydrophobic processing of the surface can be suppressed. Thus, the generation of foreign substances on the surface of the wafer 10 can be suppressed, and also the adhesion between the wafer 10 and the resist can be made better. Semiconductor devices of high quality can be fabricated with high yields.

Japanese Published Patent Application No. Hei 05-315233 (1993) discloses the art that before the HMDS processing, a semiconductor substrate is mounted on a plate heated at 80° C. to be processed for 30 seconds at an about 60 mmHg degrees of vacuum, whereby water is removed from the semiconductor substrate surface. However, at the heating temperature of 80° C., it is difficult to remove water from the semiconductor substrate surface without failure for a short period of time even at a reduced pressure.

In the present embodiment, water 10 is heated at the above-described high temperature, which makes it possible to removed water from the surface of the wafer 10. In the present embodiment, the pressure reduction is not necessary for the heat processing, which allows to use simple heating means.

The art disclosed in Japanese Published Patent Application No. Hei 05-315233 (1993) is for improving the adhesion of the resist film, and is quite different from the present invention, which is for suppressing the occurrence of the foreign substances. Japanese Published Patent Application No. Hei 05-315233 (1993) neither discloses nor suggests the heating temperature for preventing the occurrence of the foreign substances.

(Evaluation Result)

Wafers coated with a resist by the resist application method according to the present embodiment and the prior art resist application methods were compared for evaluation in numbers of foreign substances detected by a foreign substance detector.

Figure 3A:
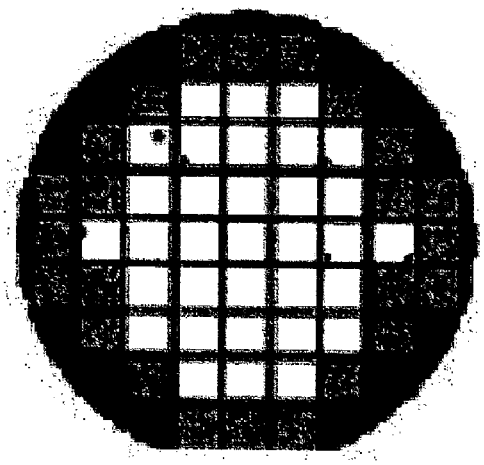
FIGS. 3A and 3A are views of evaluation results.
Figure 3B:
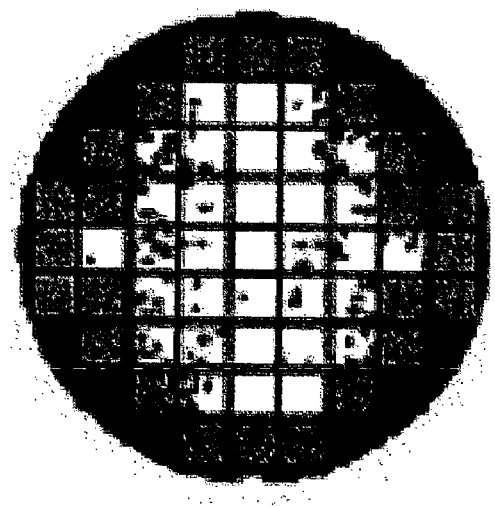
Figure 4:
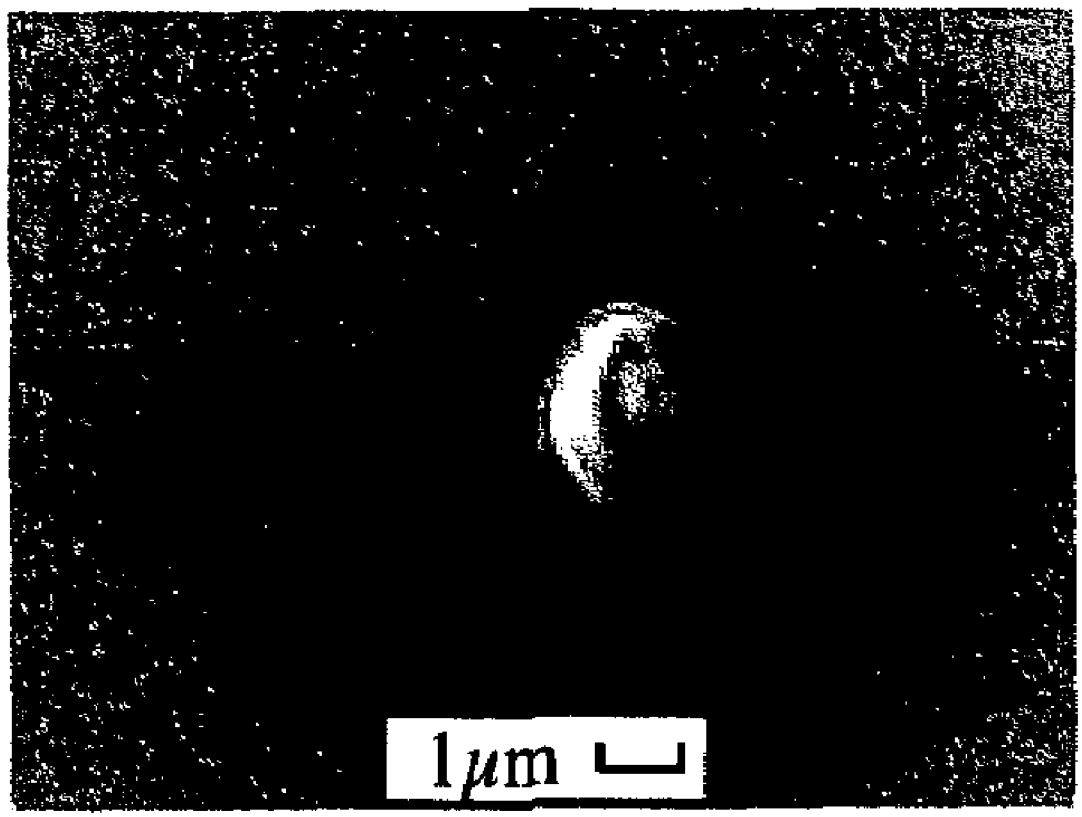
FIG. 4 is a picture of a foreign substance.

FIGS. 3A and 3B show pictures of the wafers coated with the resist, which show the results of the detection of foreign substances by the foreign substance detector. FIG. 3A is the picture of the wafer coated with the resist by the resist application method according to the present embodiment. FIG. 3B is the picture of the wafer coated with the resist by the prior art method. In the wafer pictures, scattered points of gray to black indicate foreign substances. The numbers indicated below the respective pictures indicate numbers of foreign substances produced due to the hydrolysis of the HMDS with respect to total numbers of the detected foreign substances.

In the case of the present embodiment, of the total number 16 of the detected foreign substances, the number of the foreign substances generated due to the hydrolysis was 0. In contrast to this, in the case of the prior art method, of the total number 184 of the detected foreign substances, the number of the foreign substances generated due to the hydrolysis of the HMDS was 109.

Based on the results shown in FIGS. 3A and 3B, it has been found that the resist application method according to the present embodiment can drastically decrease the number of foreign substances generated due to the hydrolysis of the HMDS which are to be the cause for pattern defects in the etching in comparison with the prior art method. It has been also found that the total number of the foreign substances detected on the wafer coated with the resist can be smaller.

[Modifications]

The present invention is not limited to the above-described embodiment and can cover other various modifications.

For example, in the above-described embodiment, the hydrophobic processing was performed by using HMDS, but the hydrophobic processing material to be used in the making the surface hydrophobic is not limited to HMDS.

In the present embodiment, the clean dry air has a −60° C. dew point in the atmospheric pressure. However, the water content of the clean dry air is not limited to this, and the clean dry air can have a humidity of, e.g., below 20% including 20%.

In the present embodiment, the dry clean air is fed into the respective processing units, and the serial processing is performed in the dehumidified atmosphere. However, a gas to be fed into the respective processing unit is not limited to the clean dry air, and any gas can be used as long as the gas is dehumidified. In place of the clean dry air, an inert gas, e.g., nitrogen gas, rare gas or others may be fed. Otherwise, a mixed gas of them may be used. The use of the dry clean air is free from the risk of oxygen deficiency accidents which are present in the use of nitrogen gas or others, and has an advantage that safety equipments are not required.

In the above-described embodiment, a resist is applied onto wafers. However, the present invention is not limited to the application of a resist onto wafers and is applicable widely to the resist application onto various substrates, such as semiconductor substrates, glass substrates, etc.

In the above-described embodiment, the resist is applied onto wafers by spin coating. However, the method for applying a resist onto wafers is not limited to the spin coating.

In the above-described embodiment, the serial process up to the application of the resist to the wafer is described. However, it is possible that the resist application method according to the present invention is incorporated in the semiconductor device fabrication steps to form resist films to be used in forming various patterns, as of insulation layers, wiring layers, etc. of semiconductor devices.

What is claimed is:

1. A resist application method comprising the steps of:
   thermal processing for evaporating water from a surface of a substrate, said substrate containing amorphous silicon on the surface thereof, the step of thermal processing being performed in a first dehumidified atmosphere having a humidity below 20% including 20%;
   making the surface of the substrate hydrophobic with a hydrophobic processing material of hexamethyldisilazane, the step of making the surface of the substrate hydrophobic being performed in a second dehumidified atmosphere having a humidity below 20% including 20%; and
   applying a resist onto the substrate in a humid atmosphere controlled to have a prescribed room temperature and a prescribed humidity,
   the method further comprising the steps of:
   carrying the substrate to the step of thermal processing through a carrying compartment with a third dehumidified atmosphere therein, the third dehumidified atmosphere having a humidity below 20% including 20% and
   carrying the substrate from the step of thermal processing to the step of making the surface of the substrate hydrophobic through the carrying compartment,
   the humid atmosphere having the prescribed humidity higher than the first to the third dehumidified atmospheres.

2. A resist application method according to claim 1, wherein
   the first to the third dehumidified atmospheres are dehumidified airs, nitrogen gases, rare gases or mixed gases of them.

3. A resist application method according to claim 1, wherein
   in the step of thermal processing, a temperature of the substrate is above 100° C. including 100° C.

4. A resist application method according to claim 2, wherein
   in the step of thermal processing, a temperature of the substrate is above 100° C. including 100° C.

5. A resist application method according to claim 1, wherein
   in the step of making the surface of a substrate hydrophobic, the substrate surface is made hydrophobic with a temperature of the substrate surface being above 100° C. including 100° C.

6. A resist application method according to claim 2, wherein
   in the step of making the surface of a substrate hydrophobic, the substrate surface is made hydrophobic with a temperature of the substrate surface being above 100° C. including 100° C.

7. A method for fabricating a semiconductor device comprising the steps of:
   thermal processing for evaporating water from a surface of a semiconductor substrate, said semiconductor substrate containing amorphous silicon on the surface thereof, the step of thermal processing being performed in a first dehumidified atmosphere having a humidity below 20% including 20%;
   making the surface of the substrate hydrophobic with a hydrophobic processing material of hexamethyldisilazane, the step of making the surface of the semiconductor substrate hydrophobic being performed in a second dehumidified atmosphere having a humidity below 20% including 20%; and
   applying a resist onto the semiconductor substrate in a humid atmosphere controlled to have a prescribed room temperature and a prescribed humidity,
   the method further comprising the steps of:
   carrying the semiconductor substrate to the step of thermal processing through a carrying compartment with a third dehumidified atmosphere therein, the third dehumidified atmosphere having a humidity below 20% including 20%; and
   carrying the semiconductor substrate from the step of the thermal processing to the step of making the surface of the semiconductor substrate hydrophobic through the carrying compartment,
   the humid atmosphere having the prescribed humidity higher than the first to the third dehumidified atmospheres.

* * * * *